United States Patent
Imamiya et al.

[11] Patent Number: 6,031,764
[45] Date of Patent: Feb. 29, 2000

[54] NONVOLATILE SEMICONDUCTOR MEMORY DEVICE

[75] Inventors: Kenichi Imamiya, Kawasaki; Koji Sakui, Tokyo; Junichi Miyamoto, Yokohama, all of Japan

[73] Assignee: Kabushiki Kaisha Toshiba, Kawasaki, Japan

[21] Appl. No.: 09/208,744

[22] Filed: Dec. 10, 1998

[30] Foreign Application Priority Data

Dec. 11, 1997 [JP] Japan ..................... 9-340970

[51] Int. Cl.⁷ ..................................... G11C 16/04
[52] U.S. Cl. .................. 365/185.29; 365/185.11; 365/185.17
[58] Field of Search .............. 365/185.11, 185.17, 365/185.21, 185.23, 185.29

[56] References Cited

U.S. PATENT DOCUMENTS

| | | | |
|---|---|---|---|
| 5,280,454 | 1/1994 | Tanaka et al. | 365/218 |
| 5,402,373 | 3/1995 | Aritome et al. | 365/185 |
| 5,615,148 | 3/1997 | Yamamura et al. | 365/185.11 |
| 5,708,606 | 1/1998 | Tanzawa et al. | 365/185.17 |
| 5,745,413 | 4/1998 | Iwahashi | 365/185.17 |
| 5,818,756 | 10/1998 | Sakui et al. | 365/185.17 |
| 5,877,982 | 3/1999 | Iwahashi | 365/185.17 |
| 5,909,398 | 6/1999 | Tanzawa et al. | 365/185.29 |

FOREIGN PATENT DOCUMENTS 4-306574 12/1992 Japan .

*Primary Examiner*—Son Mai
*Attorney, Agent, or Firm*—Banner & Witcoff, Ltd.

[57] ABSTRACT

A nonvolatile semiconductor device comprises a memory cell array with, for example, NAND memory cells, a row decoder for selecting and driving word lines, and data sense amplifier/latch circuits for exchanging data with the selected memory cells via bit lines. The memory cell array is divided into blocks in the direction of word line. The individual blocks are formed in wells formed separately in a semiconductor substrate. Each word line driven by the row decoder is provided continuously by means of control transistors formed in the boundary areas between blocks. Turning off the control transistors enables the data to be erased simultaneously block by block.

14 Claims, 11 Drawing Sheets

NONVOLATILE SEMICONDUCTOR MEMORY DEVICE

BACKGROUND OF THE INVENTION

This invention relates to a nonvolatile semiconductor memory device applied to an EEPROM or flash memory composed of electrically rewritable nonvolatile memory cells.

In recent years, electrically rewritable nonvolatile semiconductor memory devices have been put to practical use in the form of EEPROMs or flash memory devices. Especially, a NAND EEPROM where memory cells are connected in series to form NAND cells has been attracting because of its high integration.

The memory cells in the NAND EEPROM have an FETMOS structure where a floating gate (a charge storage layer) and a control gate are laid one on top of the other via an insulating film on a semiconductor substrate. The memory cells are connected in series in such a manner that adjacent cells share their source and drain, thereby forming NAND cells. The NAND cells are arranged in a matrix to construct a memory cell array. The drain at one end of a set of NAND cells arranged in one direction on the memory cell array is connected to a bit line via a select gate transistor and the source at the other end of the set is connected to a common source line via another select gate transistor.

This type of NAND EEPROM has been described in, for example, K. D. Suh, et al., "A 3.3-V 32-Mb NAND Flash Memory with Incremental Step Pulse Programming Scheme," IEEE J. Solid-State Circuits, Vol. 30, Nov. 1995, pp. 1149–1156 or Y. Iwata, et al., "A 35-ns Cycle Time 3.3-V only 32-Mb NAND Flash EEPROM," IEEE J. Solid-State Circuits, Vol. 30, Nov. 1995, pp. 1157–1164.

The basic operation of this type of NAND EEPROM is as follows. A memory cell array is generally divided into blocks in units of word lines. For example, when 16 memory cells constitute a NAND cell, a memory cell array is divided into blocks in units of 16 word lines. This enables cells to be selected in blocks. To erase the data, all the word lines in the selected block are made 0V and an erase voltage of about 20V is applied to a p-type well in which the memory cell array has been formed. This permits the electrons in the floating gates of the memory cells to leak away to the substrate in a form of FN tunnel current. As a result, the threshold values of the memory cells in the selected block are brought into a negative erased state (e.g., data "0"). For the unselected blocks, the word lines are placed in a floating state, which raises the potential of the word lines through the capacitive coupling with the substrate, thereby preventing the data from being erased.

To read the data, 0V is applied to the selected word line and a pass voltage is applied to the unselected word lines. The pass voltage enables conduction even if the threshold values of the memory cells are positive (data "1"). In this state, data reading is done by sensing the conduction between the common source line and bit line. If a memory cell connected to the selected word line has data "0", conduction will be permitted between the common source line and bit line.

Data writing is done in the opposite voltage relations to those in data erasing. The p-type well is made 0V, a write voltage of about 20V is applied to the selected word line, and an intermediate voltage is applied to the unselected word lines. Depending on the potential applied to the bit line according to the data to be written, the channel potential is controlled in such a manner that electrons are injected from the channel into the floating gate in the case of "1" data and are prevented from being injected in the case of "0" data. The bit line with "1" data is made 0V and the data is transferred to the channel of the memory cell of the selected word line. As a result, a high voltage is applied between the selected word line and channel, which injects electrons into the floating gate of the memory cell. The bit line with "0" data is made Vcc. After the data has been transferred to the channel of the memory cell, the bit line is placed in the floating state. This permits the potential of the channel to rise further through the capacitive coupling with the word line, which prevents a high voltage from being applied between the selected word line and channel, thereby preventing electrons from being injected.

In data erasure where a high voltage is applied to the p-type well on which the entire memory cell array has been formed, erasing only the memory cells along one word line (this is usually called one page) is not effected, in general, because the other word lines are disturbed seriously. Methods of preventing the data from being erased in the unselected NAND blocks includes a method of applying the same high voltage as that of the p-type well to all the word lines of the unselected blocks and a method of keeping all the word lines of the unselected blocks in the floating state. With the latter method, the capacitive coupling with the p-type well brings all the word lines of the unselected blocks to a constant high potential, preventing the data from being erased.

After the data has been written or erased, verify reading is effected to verify whether the threshold values of the memory cells lie in a specific range.

As described earlier, in the conventional NAND EEPROM, the data is written in one word line (or in one page) and the data is erased in NAND blocks including 16 word lines in the case of 16-stage NAND cells. Therefore, for example, it is impossible to rewrite the data only in part of the memory cells of a word line in the same NAND block or to protect the flag bits for the data management from erasure.

To change the write page size or the erase page size, the number of memory cells connected to one word line is reduced to half, for example. To realize this, the number of row decoders for selecting and driving the word lines has to be doubled because the word lines are divided into two groups. For example, in the case of the existing 64-Mbit NAND EEPROM, the row decoder circuit accounts for 5.3% of the 123-mm$^2$ chip size. To meet the above specifications, a 5.3% increase in the chip size is needed. If the word lines are divided into four groups or eight groups, the number of row decoders will increase accordingly, resulting in an increase in the chip size and a rise in the chip cost.

Conversely, when an attempt is made to keep the write page size or erase block size constant in order to manufacture a NAND EEPROM having a larger storage capacity, the chip is made long and narrow and thus unable to fit in the package, unless the number of the row decoders divided is increased.

The technique for dividing a memory cell array into two wells in the direction of word line and controlling the potential of the wells separately in order to write or erase the data of the memory cells connected to the selected word lines has been disclosed in, for example, Jpn. Pat. Appln. KOKAI Publication No. 4-360574. In this publication, nonvolatile semiconductor memory devices where memory cells are selected in units of block in the write/erase operation as in the NAND EEPROM described above have not been discussed and also the word lines of the unselected blocks have not been considered.

BRIEF SUMMARY OF THE INVENTION

The object of the present is to provide a nonvolatile semiconductor memory device capable of changing the write size in the direction of word line without increasing the number of row decoder or writing data erroneously.

According to a first aspect of the present invention, there is provided a nonvolatile semiconductor memory device comprising: a semiconductor substrate having a plurality of wells separated from each other; a plurality of bit lines provided substantially in parallel on the semiconductor substrate including the wells; a plurality of word lines provided substantially in parallel so as to cross the bit lines on the semiconductor substrate including the wells; a memory cell array composed of a plurality of memory cells placed at intersections of the bit lines and the word lines, the memory cells being electrically rewritable nonvolatile memory cells to be selected by a corresponding one of the bit lines and at least a corresponding one of the word lines, the memory cell array being divided into a plurality of first blocks in a direction in which the bit lines extend and divided into a plurality of second blocks in a direction in which the word lines extend, and the first blocks being formed on one of the wells and the second blocks being respectively formed on the wells separated from each other; a plurality of control transistors each formed in a boundary area between two adjacent ones of the second blocks and connected to the word lines in such a manner that the transistors are inserted in the word lines, respectively; a word line driving circuit coupled to the word lines; and a plurality of data sense amplifier/latch circuits coupled to the bit lines, respectively.

It is desirable that each of the control transistors is a MOS transistor with a gate electrode and the control transistors formed in the boundary area is connected to each other by way of the gate electrode.

In the nonvolatile semiconductor memory device, the data stored in corresponding ones of the memory cells included in a selected one of the first blocks and in a selected one of the second blocks are erased in unison by setting potential of corresponding ones of the word lines included in the selected one of the first blocks at a reference voltage, corresponding ones of the word lines included in unselected ones of the first blocks other than the selected one in a floating state, one of the wells in which the selected one of the second blocks is included at an erase voltage higher than the reference voltage, another of the wells in which unselected ones of the second blocks other than the selected one at the reference voltage and at the same time, by controlling a voltage applied to the gate electrode so that corresponding ones of the control transistors included in the corresponding ones of the word lines included in the selected one of the first blocks are in a conducting state and corresponding ones of the control transistors included in the word lines included in the unselected ones of the first blocks are in a nonconducting state.

It is desirable that each of the control transistors is a depletion-type MOS transistor, with a voltage applied to the gate electrode in data erasure being the reference voltage.

It is desirable that the corresponding ones of the word lines included in the unselected ones of the first block is applied with a voltage higher than the reference voltage and thereafter brought into the floating state.

It is desirable that the control transistors is made conducting when the data is written into the memory cells or when the data is read from the memory cells.

It is desirable that, when the data is written into the memory cells, a voltage higher than the reference voltage is applied to a selected one of the word lines included in the selected one of the first blocks, a pass voltage to make the memory cells conducting is applied t o unselected ones of the word lines, the reference voltage is applied to a corresponding one of the wells in which the selected one of the second blocks is included, and a mid-point voltage between the reference voltage and the write voltage is applied to corresponding ones of the well in which the unselected ones of the second blocks are included.

According to a second aspect of the present invention, there is provided a nonvolatile semiconductor memory device comprising: a semiconductor substrate having a plurality of wells separated from each other; a plurality of bit lines provided on the semiconductor substrate including the wells; a plurality of word lines provided so as to cross the bit lines on the semiconductor substrate including the wells; a memory cell array composed of a plurality of memory cells placed at intersections of the bit lines and the word lines, the memory cells being electrically rewritable nonvolatile memory cells to be selected by a corresponding one of the bit lines and at least a corresponding one of the word lines, the memory cell array being divided into a plurality of first blocks in a direction in which the bit lines extend and divided into a plurality of second blocks in a direction in which the word lines extend, and the first blocks being formed on one of the wells and the second blocks being respectively formed on the wells separated from each other; a word line driving circuit coupled to the word lines; and a plurality of data sense amplifier/latch circuits coupled to the bit lines, respectively, wherein, when the data stored in corresponding ones of the memory cells included in a selected one of the first blocks and in a selected one of the second blocks is erased, potential of corresponding ones of the word lines included in the selected one of the first blocks is set at a reference voltage, one of the wells in which the selected one of the second blocks is included is set at an erase voltage higher than the reference voltage, and another of the wells in which unselected ones of the second blocks other than the selected one are included is set at an intermediate voltage between the reference voltage and the erase voltage, and the corresponding ones of the memory cells included in the selected one of the first blocks and in the selected one of the second blocks are erased simultaneously.

It is desirable that the corresponding ones of the word lines included in the unselected ones of the first blocks other than the selected one is brought into a floating state.

It is desirable that, when data is written into the memory cells, a voltage higher than the reference voltage is applied to a selected one of the word lines included in the selected one of the first blocks, a pass voltage to make the memory cells conducting is applied to unselected ones of the word lines, the reference voltage is applied to the wells in which the selected one of the second blocks is included, and an intermediate voltage between the reference voltage and the write voltage is applied to another of the wells in which the unselected ones of the second blocks are included.

In the nonvolatile semiconductor memory devices of the first and second aspects, it is desirable that the memory cell array is composed of a plurality of NAND cells, where the memory cells included in each of the first blocks are connected in series in units of plural ones of the memory cells along each of the bit lines.

In the present invention, the memory cells connected to a single word line are divided into at least two blocks, which enables the data to be rewritten in blocks. A single word line is not divided between blocks but is formed continuously. This makes it possible to change the rewrite unit without increasing the number of row decoders for selecting word lines and therefore increasing the chip area. Instead of using the write or erase voltage and a reference voltage, for example, 0V, use of the write or erase voltage and an intermediate voltage between the write or erase voltage and the reference voltage prevents the data from being written or erased inadvertently in the unselected blocks.

In the case where the word lines extending over blocks are continuous by means of control transistors between the blocks, suitable selection of the bias condition for the control transistors reliably prevents the data from being written or erased inadvertently in the unselected blocks.

Furthermore, particularly when the present invention is applied to NAND EEPROMs, the following specification is possible: part of the memory cells along a word line are determined to be a data management area and the data is prevented from being rewritten into the management area.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, referring to the accompanying drawings, embodiments of the present invention will be explained.

(First Embodiment)

Figure 1:
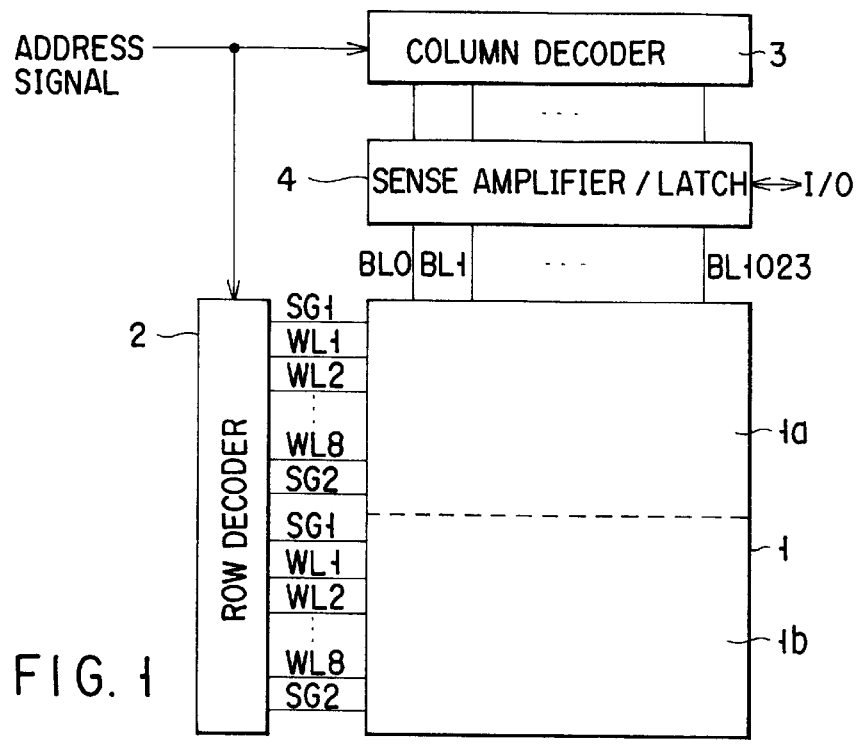
FIG. 1 is a block diagram of the main part of a NAND EEPROM according to a first embodiment of the present invention.

FIG. 1 is a block diagram of the main part of a NAND EEPROM according to a first embodiment of the present invention. The EEPROM comprises a memory cell array 1, a row decoder 2 for selecting and driving a word line in the memory cell array 1 on the basis of an externally supplied address, a column decoder 3 for selecting a bit line, and a sense amplifier/latch circuit 4 for reading and latching bit line data and latching write data. The row decoder 2, the column decoder 3, and the sense amplifier/latch circuit 4 are provided in the peripheral area of the memory cell array 1.

Figure 2:
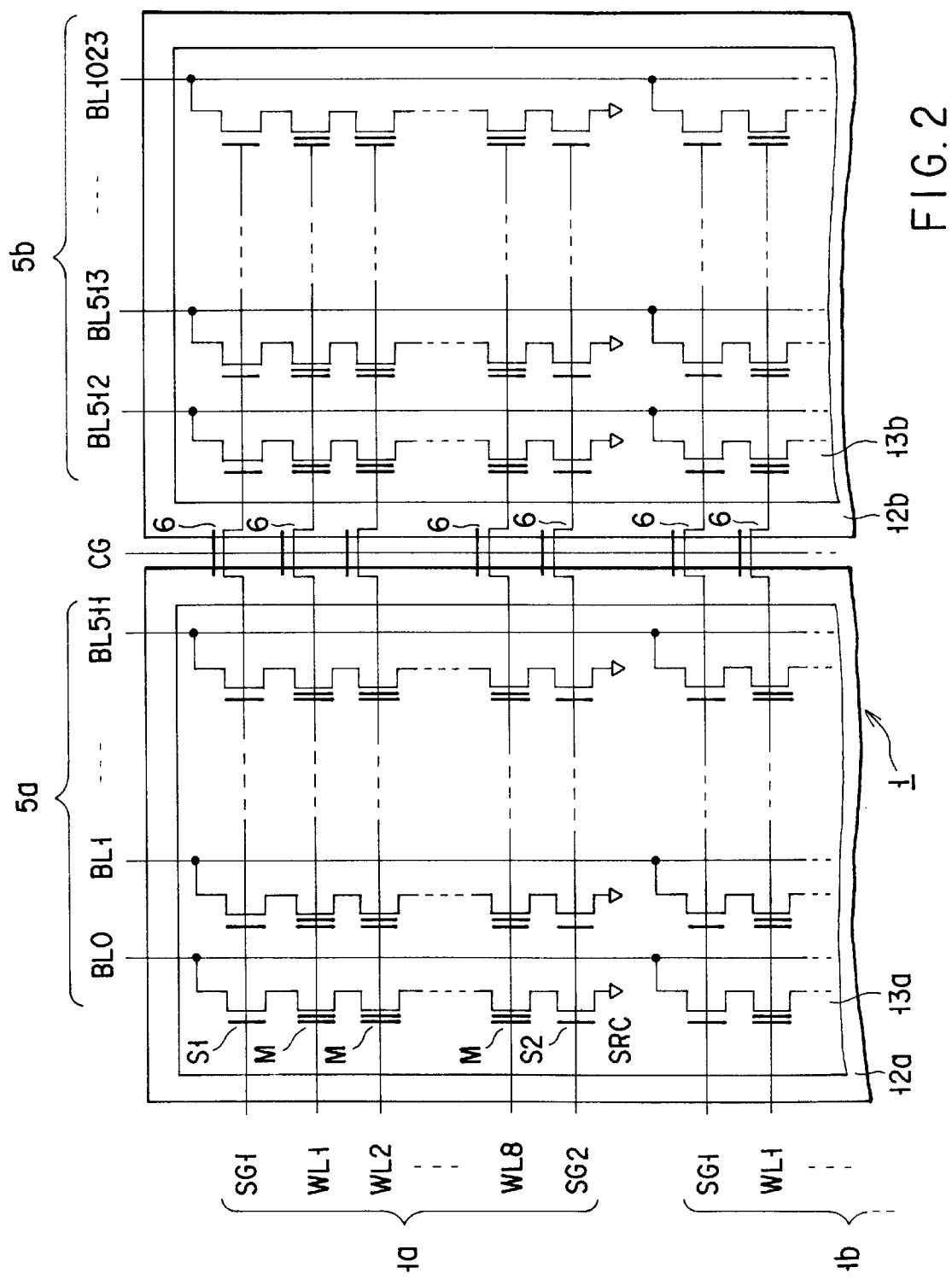
FIG. 2 is a circuit diagram of a memory cell array according to the first embodiment.

As an example of the memory cell array 1, FIG. 2 shows a case where eight memory cells M are connected in series to form a NAND cell. The drain at one end of a series connection of eight memory cells M is connected to a bit line BL via a select gate transistor S1 and the source at the other end is connected to a common source line SRC via a select gate transistor S2.

The memory cell array 1 is divided into NAND blocks 1a, 1b, . . . in the direction of bit line. In the blocks, cells are selected or unselected in units of a NAND cell by the row decoder 2. The memory cell array 1 is also divided into two sub-blocks 5a and 5b in the direction of word line. Each of the sub-blocks 5a and 5b includes, for example, 512 bit lines BL.

Figure 3A:
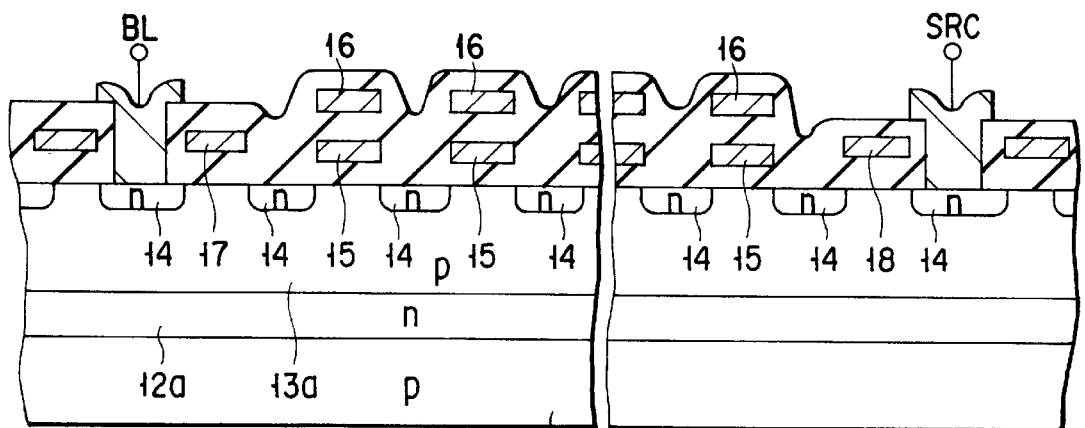
FIG. 3A is a sectional view of the memory cell array of the first embodiment taken along a bit line.
Figure 3B:
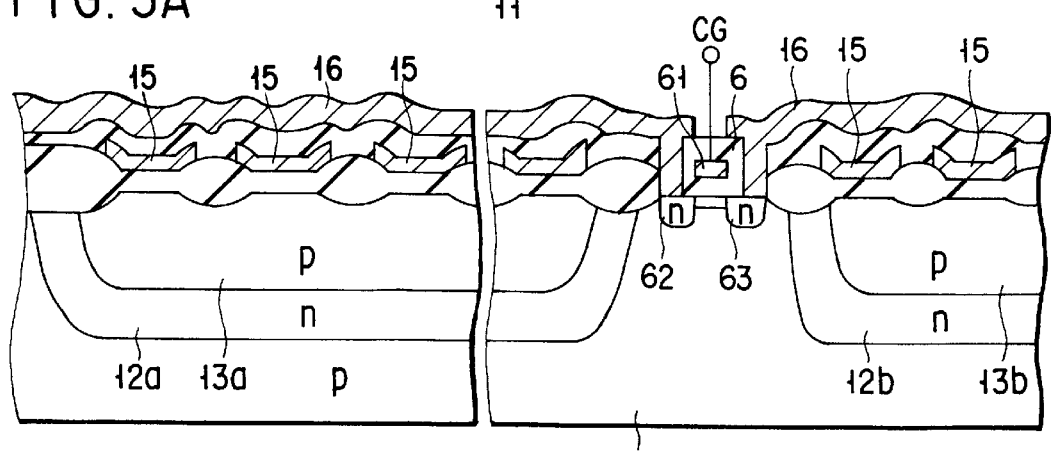
FIG. 3B is a sectional view of the memory cell array of the first embodiment taken along a word line.

FIG. 3A is a sectional view of a single NAND cell in the memory cell array 1 of FIG. 2 taken along a bit line. FIG. 3B is a sectional view of the NAND cell along a word line, extending over the two blocks 5a and 5b. As shown in FIG. 3B, n-type wells 12a and 12b are formed separately in the p-type silicon substrate 11. The p-type wells 13a and 13b are formed in the n-type wells 12a and 12b. The two blocks 5a and 5b are formed on the p-type wells 13a and 13b.

The memory cells M are formed by stacking a floating gate 15 and a control gate 16 via an insulating film on the p-type well 13 as shown in FIG. 3A. The select gate transistors S1, S2 are produced by forming gate electrodes 17, 18 via an insulating film at both ends of the series connection of eight memory cells M. The control gate 16 of each memory cell M and the gate electrodes 17, 18 of the select gate transistors S1, S2 are formed consecutively in the direction of word line and act as word lines WL and select gate lines SG1, SG2, respectively.

The word lines WL and select gate lines SG are formed in such a manner that they extend over the two blocks 5a and 5b. In the first embodiment, as shown in FIG. 2, control transistors 6 for connecting the word lines and select gate line on one side to those on the other side are provided in the boundary area between the two blocks 5a and 5b. The gate electrode 61 of each control transistor 6 is drawn as a common terminal CG.

The control transistor 6, for example, as shown in FIG. 3B, is constructed by forming a gate electrode 61 via a gate insulating film on the p-type silicon substrate 11 between the two blocks 5a and 5b and then forming an n-type source layer 62 and an n-type drain layer 63. The right end of the word line WL in the block 5a is connected to the left end of the word line WL in the block 5b via a control transistor 6 by contacting the right end to the n-type source layer 62 of the transistor 6 and the left end to the n-type drain layer 63 of the transistor 6. The control transistor 6 is assumed to be, for example, a depletion-type MOS transistor. In the first embodiment, as explained later, the word lines WL in the block 5a are connected to or disconnected from the word lines WL in the block 5b by selecting a bias applied to the control terminal CG in a data rewrite or read operation.

Although the bias applied to the control terminal CG is different from when a depletion-type MOS transistor is used, an enhancement-type MOS transistor may be used as the control transistor 6.

Figure 4:
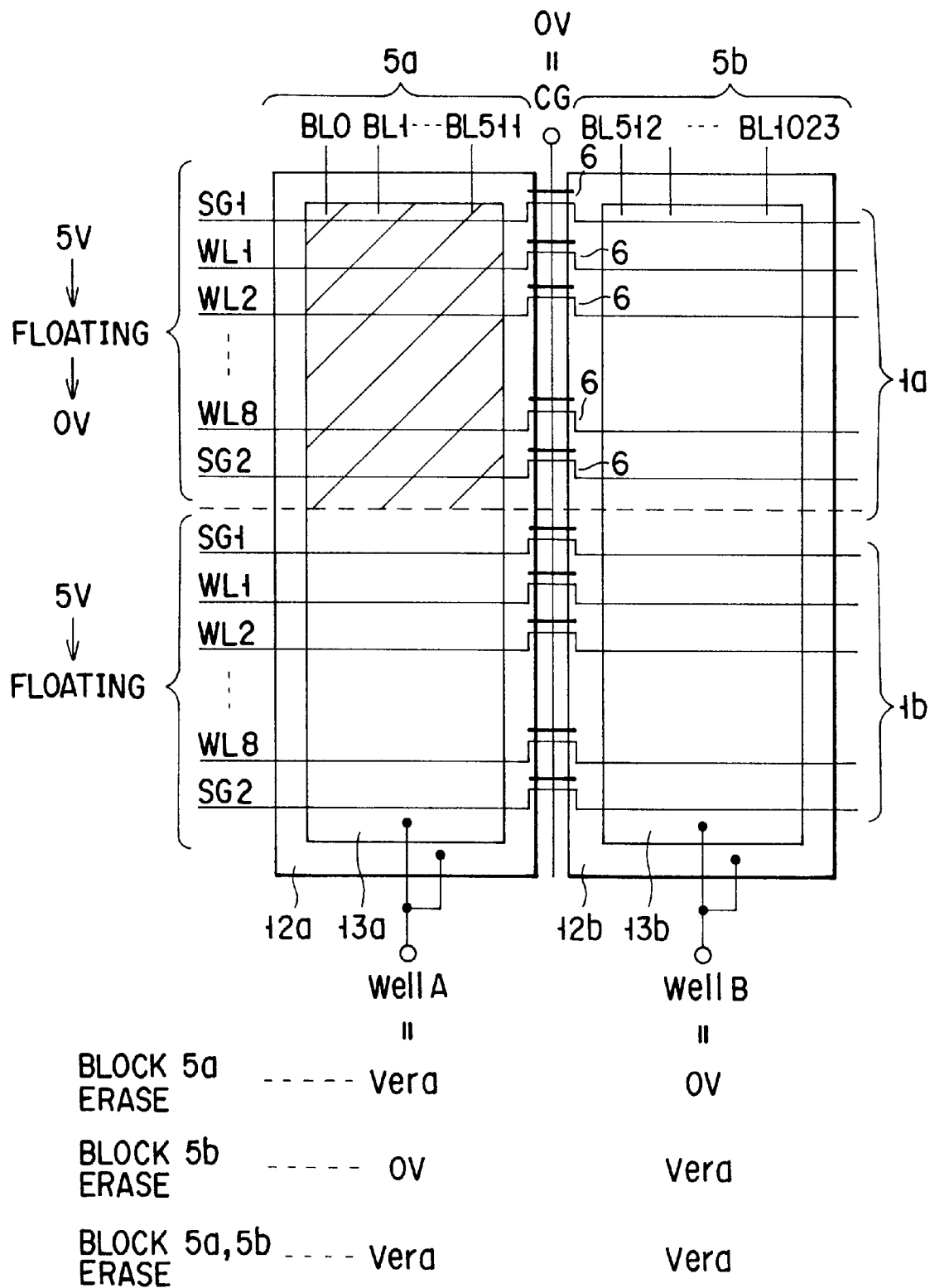
FIG. 4 is a diagram to help explain the operation of erasing data in the EEPROM of the first embodiment.
Figure 5:
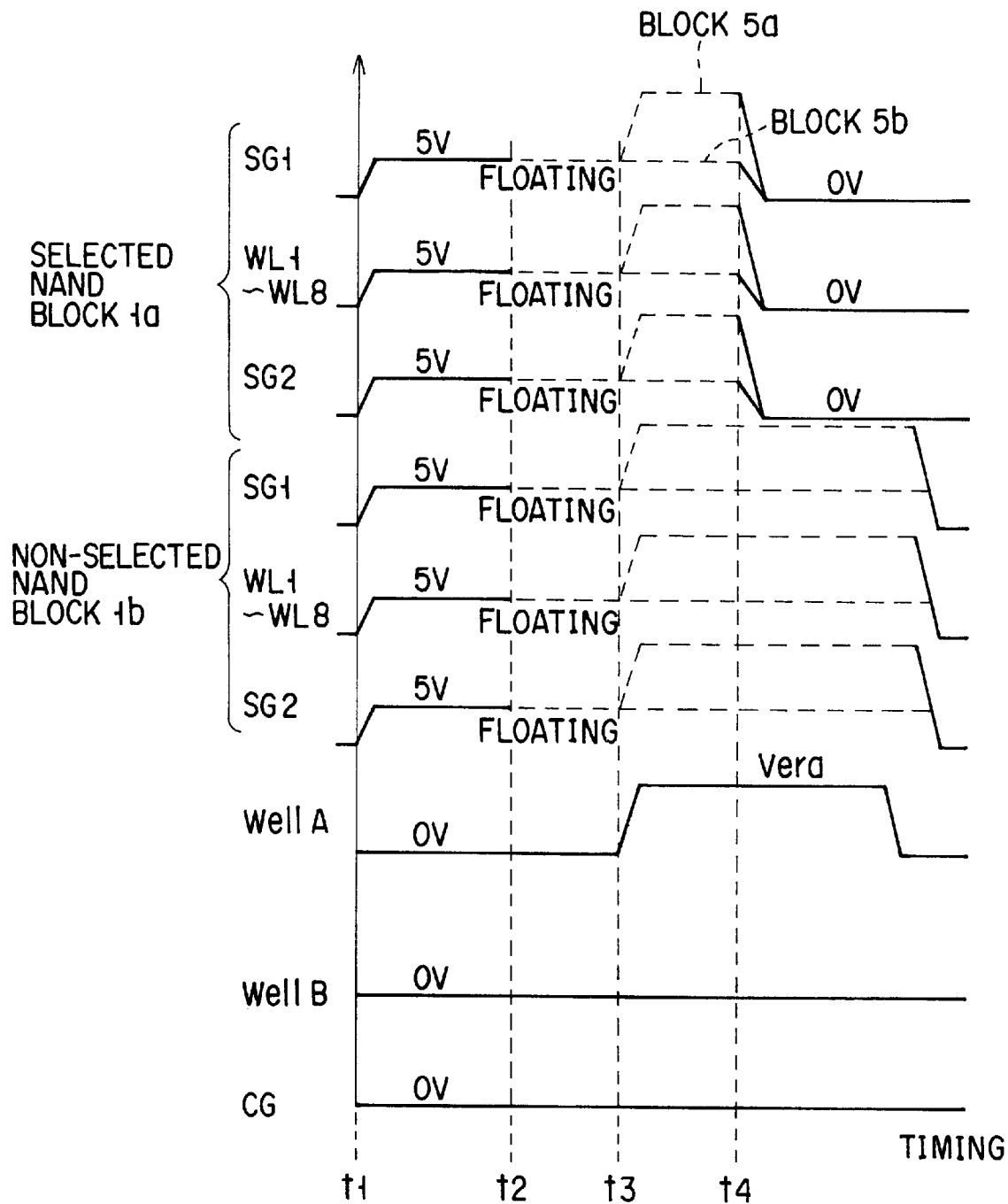
FIG. 5 is a timing chart to help explain the operation of erasing data in FIG. 4.

FIG. 4 shows the potentials at each section in data erasing. FIG. 5 shows the waveforms (or is a timing chart) in data erasing. The data is erased as follows: the control terminal CG drawn out of the gate of the control transistor 6 is made 0V (a reference voltage). The well control terminal WellA drawn out of the n-type well 12a and p-type well 13a in the block 5a and the well control terminal WellB drawn out of the n-type well 12b and p-type well 13b in the block 5b are controlled in such a manner that one of the two blocks 5a and 5b is selected for erasing.

At time t1, all the word lines in both the NAND blocks 1a, 1b are charged by the row decoder up to about 5V. At this time, if the threshold value of the control transistor 6 is supposed to be Vth, as the control terminal CG=0V, the word lines in the right block 5b are charged to −Vth. And thereby the control transistor 6 becomes to the nonconducting state.

Then, after all the word lines have been placed in the floating state at time t2, when the memory data of the left block 5a are erased, an erase voltage Vera of about 20V is applied to the well control terminal WellA in the left block at time t3. At this time, the well control terminal WellB in the right block is allowed to remain 0V. This permits the word lines in the left block 5a to rise close to about 20V through the capacitive coupling with the p-type well 13a. Because the control transistor 6 is off, the word lines in the right block 5b remain at the original floating potential −Vth. At this state, the condition for erasing all the memory cells is not satisfied.

Thereafter, at time t4, while the word lines in the unselected NAND block 1b are kept in the floating state, all the word lines in the selected NAND block are made 0V. At this time, when the charges on the word lines in the left block 5a have been discharged to 0V, the control transistors 6 become conducting, which permits the charges on the word lines in the right block 5b to be discharged via the control transistors 6 to 0V. In the selected left block 5a, the erase voltage Vera is applied between the word line and p-type well 13a, thereby erasing the data. In the right block 5b, the p-type well 13a and word lines are both at 0V, preventing the data from being erased. The area of the memory cells erased at this time is hatched in FIG. 4.

During the erase operation, all the word lines in the unselected NAND block 1b are in the floating state. Therefore, even when the erase voltage Vera is applied to the well control terminal WellA, all the word lines in the block 5a rise in potential to about Vera through the capacitive coupling with the p-type well 13a, preventing the erase voltage from being applied to the memory cells. At this time, the transistors 6 are off and the word lines in the right block 5b are kept at the original floating potential, preventing a large voltage from being applied between the word lines and p-type well 13b. As a result, neither erroneous writing nor erroneous erasing occurs in the unselected NAND block 1b.

As described above, with the NAND EEPROM where the data is erased in units of block, when a single selected word line, a single unselected word line, and the two wells in which the units of block are formed are considered, the potential relationship between the respective word lines and the respective wells is different from each other at the four intersections thereof. Therefore, if 0V is applied to the selected word line and an erase voltage of about 20V is applied to one well for erasure separately while no erase voltage is applied to the other well, as in the prior art, the data will be written inadvertently between the other well and the unselected word lines to which the high voltage is applied.

In the NAND block 1a, when the memory data of the right block 5b are selectively erased, the operation from when all the word lines have been charged initially until they have been placed in the floating state is the same as described above. Thereafter, the erase voltage Vera is applied to the well control terminal WellB in the right block 5b and the well control terminal WellA in the left block 5a is kept at 0V. At this time, the control transistors 6 keep the word line potential in the left block 5a at the initial charging level and the word line potential in the right block 5b rises to about 20V through the capacitive coupling with the p-type well 13b. Then, all the word lines in the NAND block 1a are made 0V, which discharges the charges on the word lines in the blocks 5a and 5b, permitting the erase voltage to be applied to the right block 5b, thereby erasing the data. The erase voltage is prevented from being applied to the memory cells in the left block 5a, inhibiting the data from being erased.

Because all the word lines in the unselected NAND block 1b are in the floating state, when erase voltage Vera is applied to the p-type well 13b, the word lines in the right block 5b rise in potential through the capacitive coupling, preventing the data from being erased. At this time, the control transistors 6 are off, which keeps the word lines in the left block 5a at the original floating potential. Therefore, neither erroneous writing nor erroneous erasing takes place.

When the memory data of the two blocks 5a and 5b in the NAND block 1a are erased simultaneously, the process from when all the word lines in the selected and unselected NAND blocks 1a and 1b have been charged to 5V until they have been placed in the floating state is the same as described above. Thereafter, the erase voltage Vera is applied to both of the well control terminals WellA and WellB. At this time, all the word lines rise in potential close to the erase voltage through the capacitive coupling. Thereafter, all the word lines in the selected NAND block 1a are made 0V. At this time, in the NAND block 1a, the word lines in the block 5b are also discharged via the control transistors 6 to 0V, erasing the data from the two blocks 5a and 5b. Because all the word lines in the unselected NAND block 1b are kept in the floating state, all the word lines rise in potential through the capacitive coupling with the p-type wells 13a and 13b, preventing the data from being erased.

In the data erasing operation in the first embodiment, the word lines are not necessarily charged initially. For instance, even when the word lines precharged at 0V are placed in the floating state, the control transistors 6 are made nonconducting, because the potential of the word lines rises through the capacitive coupling with the p-type wells 13a and 13b when the erase voltage is applied to at least one of the p-type wells 13a and 13b. In the case where the word lines are initially charged, it is possible to make the control transistors 6 nonconducting before the erase voltage is applied to the p-type wells 13a and 13b.

Figure 6:
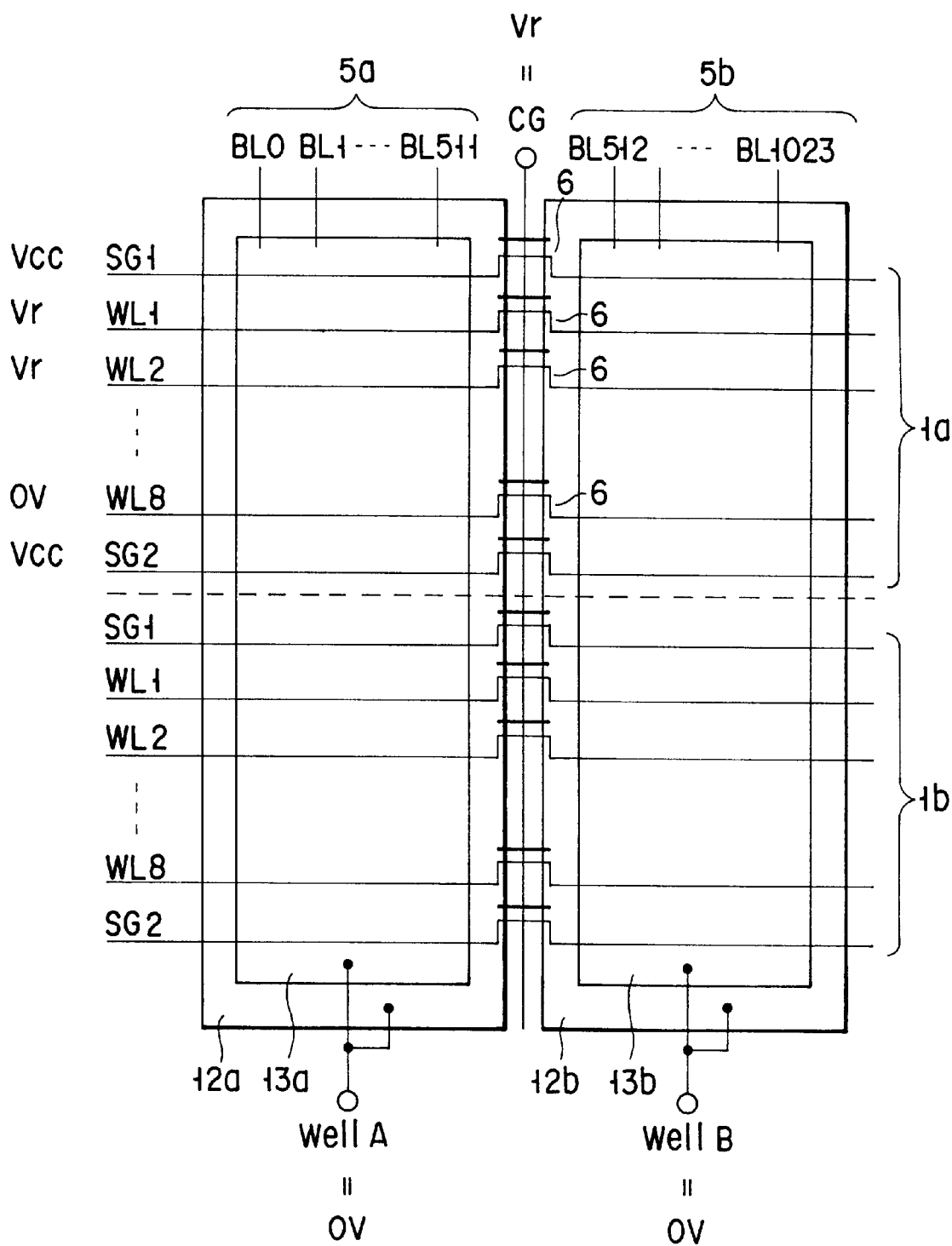
FIG. 6 is a diagram to help explain the operation of reading data in the EEPROM of the first embodiment.

FIG. 6 shows the potentials at the individual sections in a read operation in the first embodiment. The data is read from the two blocks 5a and 5b simultaneously. At this time, the well control terminal WellA in the block 5a is made 0V and the well control terminal WellB in the block 5b is also made 0V. It is assumed that the block 1a has been selected and the word line WL8 in the block 1a has been selected. At this time, the row decoder 2 applies 0V to the selected word line WL8 and such a pass voltage Vr (e.g., 4.5V) as to turn on the unselected word lines, even when the memory cell data is "1", to the remaining unselected word lines. The row decoder 2 also applies Vcc to the select gate lines SG1 and SG2. To the control terminal CG connected to the gate of the control transistor 6 between the two blocks 5a and 5b, for example, the pass voltage Vr is applied. As a result, conduction between the bit line and common source line is sensed and the data is read out. Because the pass voltage Vr has been applied to the control terminal CG, the output of the row decoder is transferred to the right block 5b without a decrease in the potential of the control transistors 6.

Figure 7:
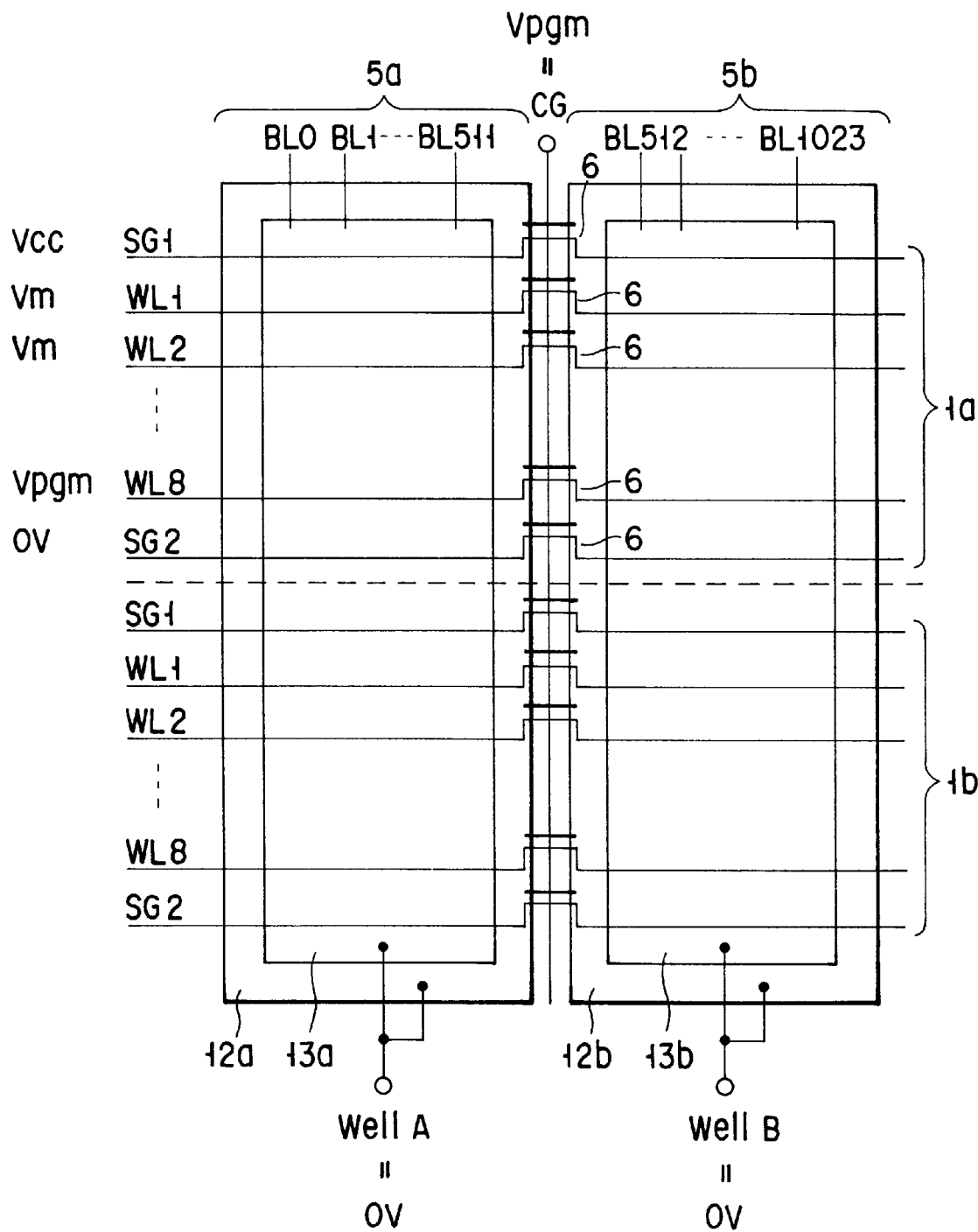
FIG. 7 is a diagram to help explain the operation of writing data in the EEPROM of the first embodiment.

FIG. 7 shows the potentials at the individual sections in a write operation in the first embodiment. A case where the data is written into the blocks 5a and 5b simultaneously will be explained. The potentials of the well control terminals WellA and WellB are at 0V as in a read operation. A write voltage Vpgm of about 20V is applied to the selected word line in the selected NAND block 1a, for example, word line WL8, an intermediate voltage (e.g., 10V) is applied to the remaining unselected word lines, Vcc (e.g., 5V) is applied to the select gate line SG1 on the bit line side, and 0V is applied to the select gate line SG2 on the common source line side. To the control terminal CG between the blocks 5a and 5b, for example, the write voltage Vpgm is applied. The potential of the bit line is set according to the writing data loaded into the sense amplifier/latch circuit 4. For example, to the bit line, 0V is applied when data is "1" and Vcc is applied when data is "0". As a result, writing is done in such a manner that the potential of the channel just under the selected word line WL8 is at a low level or at an intermediate voltage level according to the potential applied to the bit line according to the data.

When the data is written into only one of the two blocks 5a and 5b, for example, Vcc is applied to all the bit lines in the other one of the blocks 5a and 5b into which no data is written and the potential just under the word line WL8 is set at the intermediate voltage level. The other potentials are controlled so that they may have the aforementioned potential relationship.

As described above, with the NAND EEPROM of the first embodiment, data can be rewritten in blocks into which the memory cell array has been divided in the direction of word lines. The word lines are continuous via control transistors between blocks in the direction of word lines. Therefore, even if the simultaneous erase unit is made smaller, the number of row decoders need not be increased, helping reduce the chip area. Furthermore, when control transistors for connecting the word lines on one side to those on the other side are provided between blocks in the direction of word lines and suitable bias conditions are selected, this prevents a high voltage from being applied to the memory cells in the unselected blocks in the NAND blocks divided in the direction of bit lines, which avoids erroneous writing or erroneous erasing.

(Second Embodiment)

Figure 8:
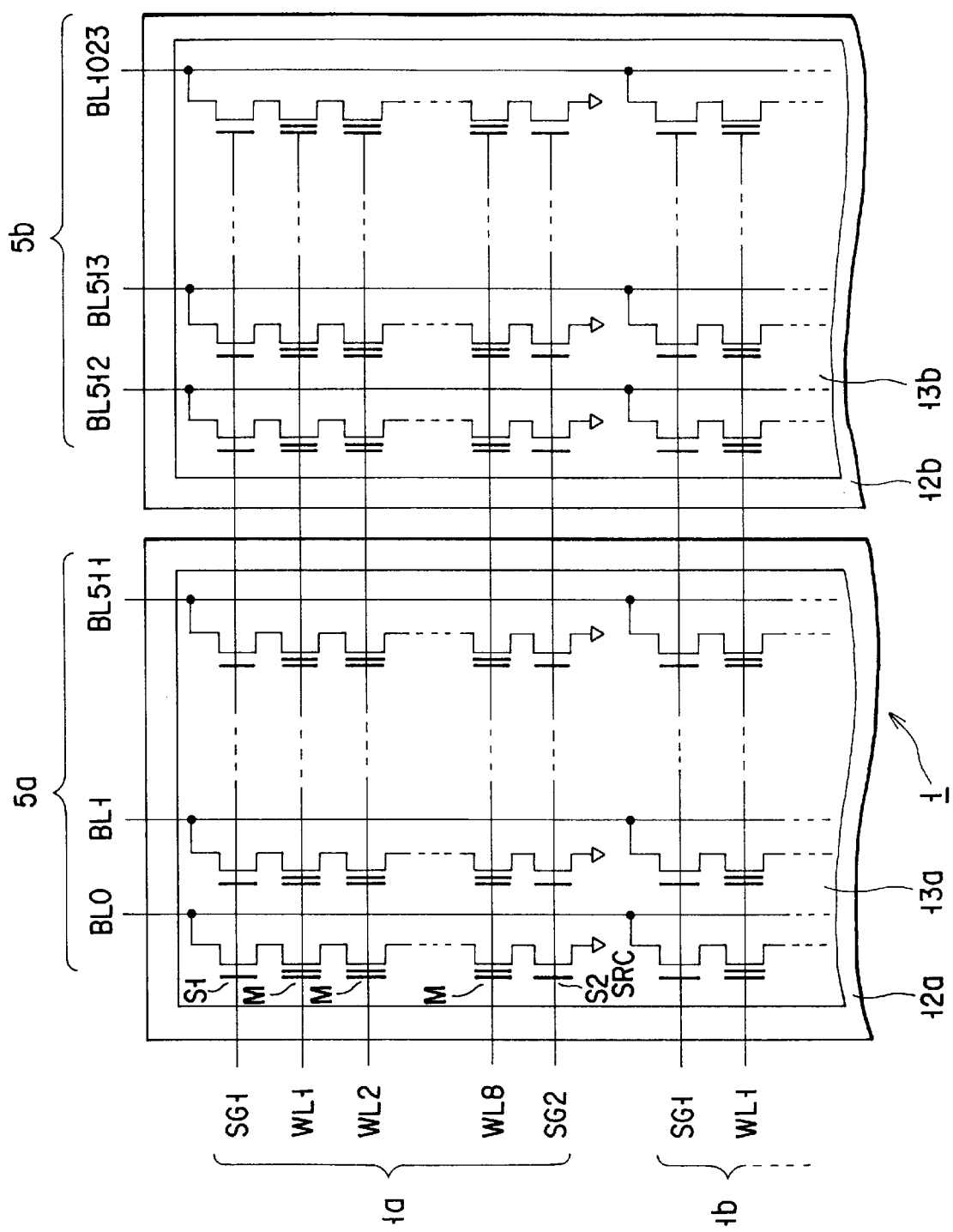
FIG. 8 is a circuit diagram of the memory cell array of an EEPROM according to a second embodiment of the present invention.

FIG. 8 is a block diagram of a memory cell array according to a second embodiment of the present invention. While in the first embodiment, the control transistors 6 for connecting the word lines on one side to those on the other side have been provided, the second embodiment does not use such control transistors 6. Continuous word lines are provided between the two blocks 5a and 5b.

Figure 9:
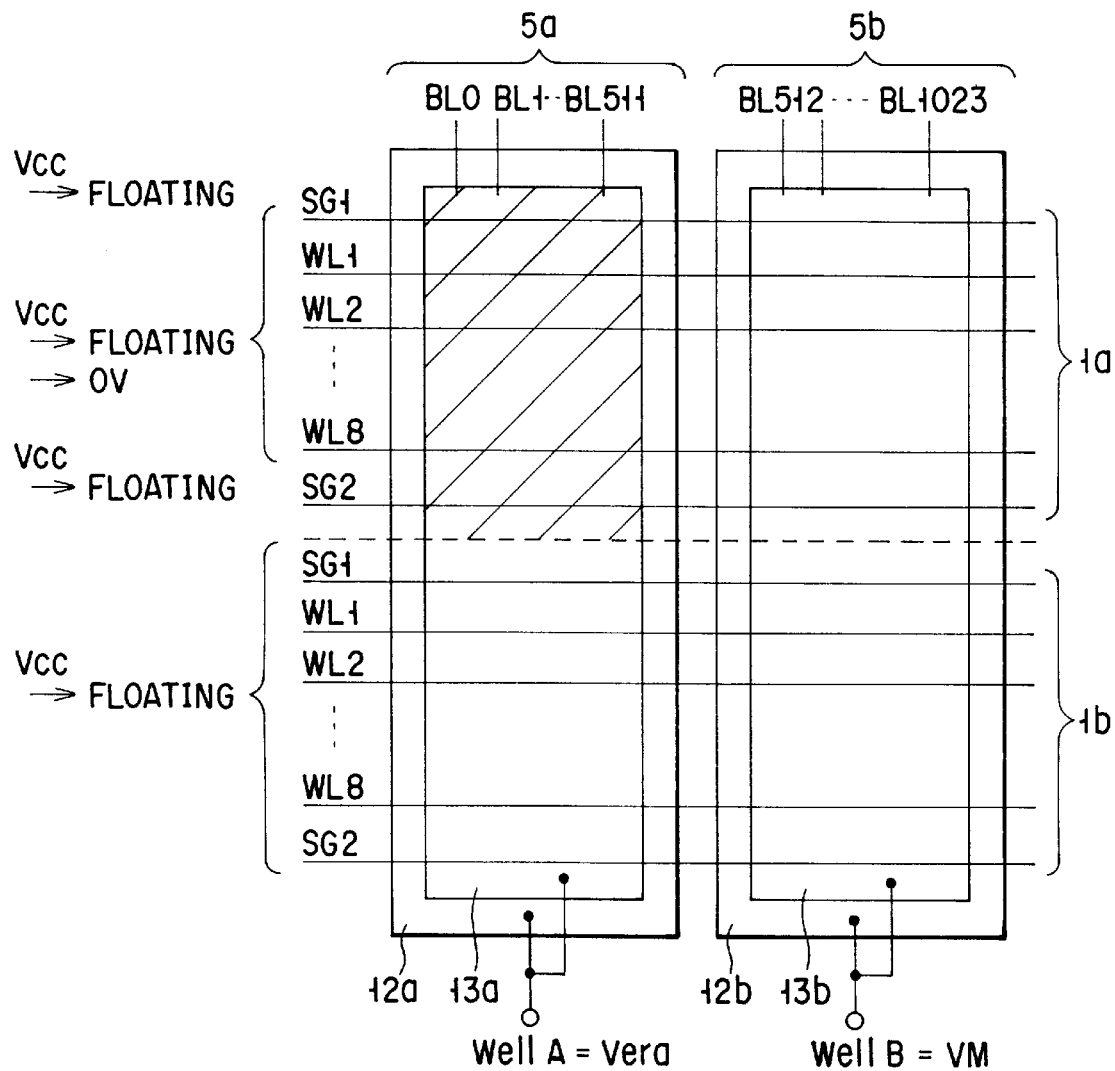
FIG. 9 is a diagram to help explain the operation of erasing data from the EEPROM of the second embodiment.
Figure 10:
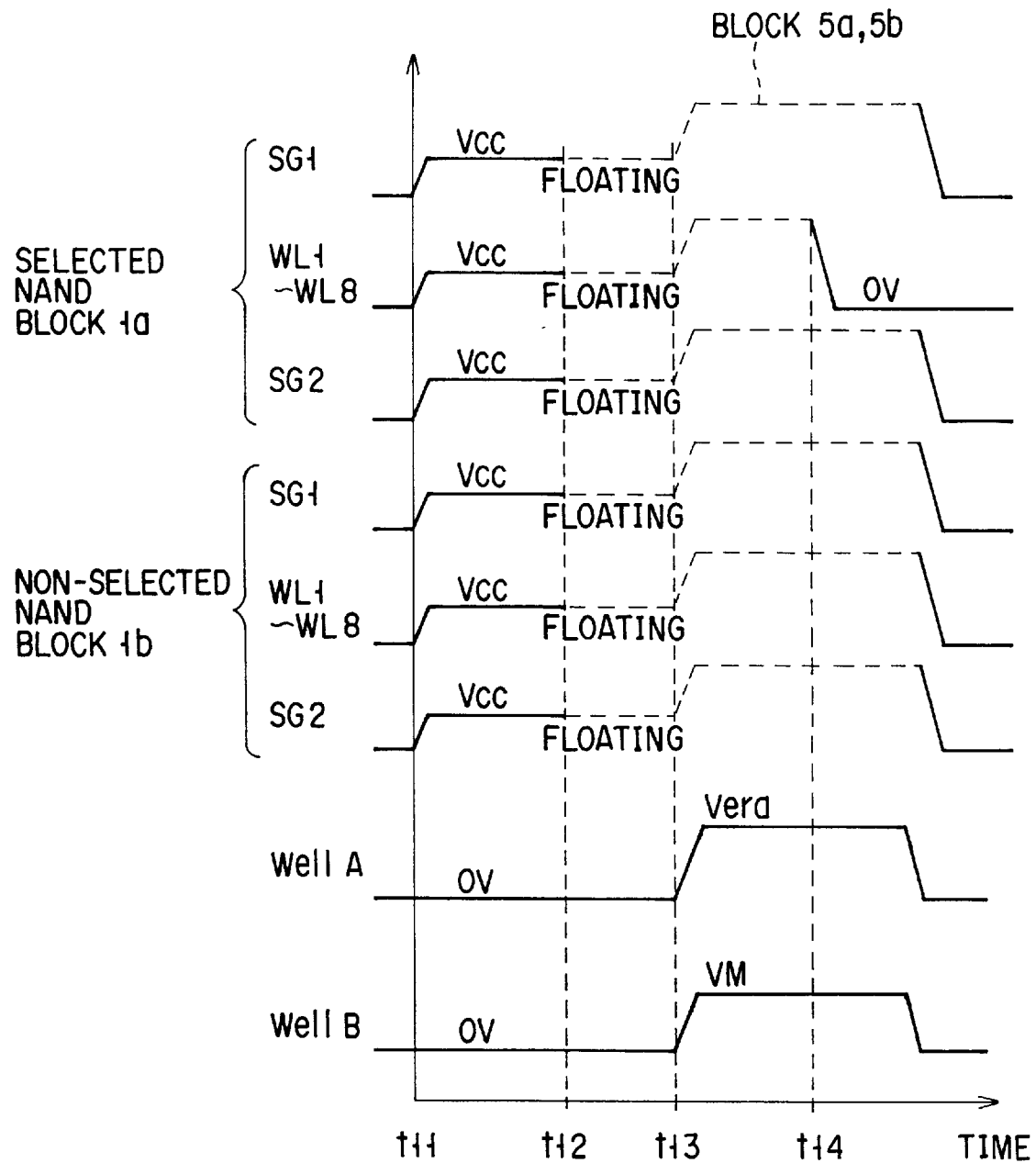
FIG. 10 is a timing chart to help explain the operation of erasing data in the second embodiment.

FIG. 9 shows the potentials at the individual sections when the data is erased from the left block 5a in the NAND block 1a. FIG. 10 shows the operating waveforms. After all the word lines and select gate lines have been charged to Vcc at time t11, they are placed in the floating state at time t12. Thereafter, at time t13, an erase voltage Vera of about 20V is applied to the well control terminal WellA in the selected block 5a and an intermediate voltage of VM of about 10V is applied to the well control terminal WellB in the unselected block 5b. At time t14, all the word lines in the selected NAND block 1a are made 0V, the select gate lines SG1 and SG2 are left in the floating state, and all the word lines and select gate lines in the unselected NAND block 1b are left in the floating state.

As a result, in the selected block 5a in the selected NAND block 1a, or the hatched area in FIG. 9, the erase voltage is applied between the p-type well 13a and all the word lines, which pulls charges out of the floating gates, thereby erasing the data. In the right block 5b in the selected NAND block 1a, the voltage between the p-type well 13b and the word lines is the intermediate voltage VM, preventing the data from being erased.

Because all the word lines in the unselected NAND block 1b are in the floating state, all the word lines rise in voltage to the mid-point value between the erase voltage Vera and the intermediate voltage VM, or to about 14V, through the capacitive coupling of the p-type wells 13a and 13b with the word lines, which prevents the data from being erased from the right and left blocks 5a and 5b. The intermediate voltage VM is applied to the right block 5b (WellB), which prevents the data from being written inadvertently into the block 5b in the unselected NAND block 1b differently from the case where the potential of the block 5b (WellB) is kept at 0V.

When the data is erased, the bit line potential in the block 5a and that in the block 5b are Vera−Vbi and VM−Vbi, respectively, assuming the built-in voltage between the p-type wells 13a and 13b and the drain diffusion layer being Vbi.

Figure 11:
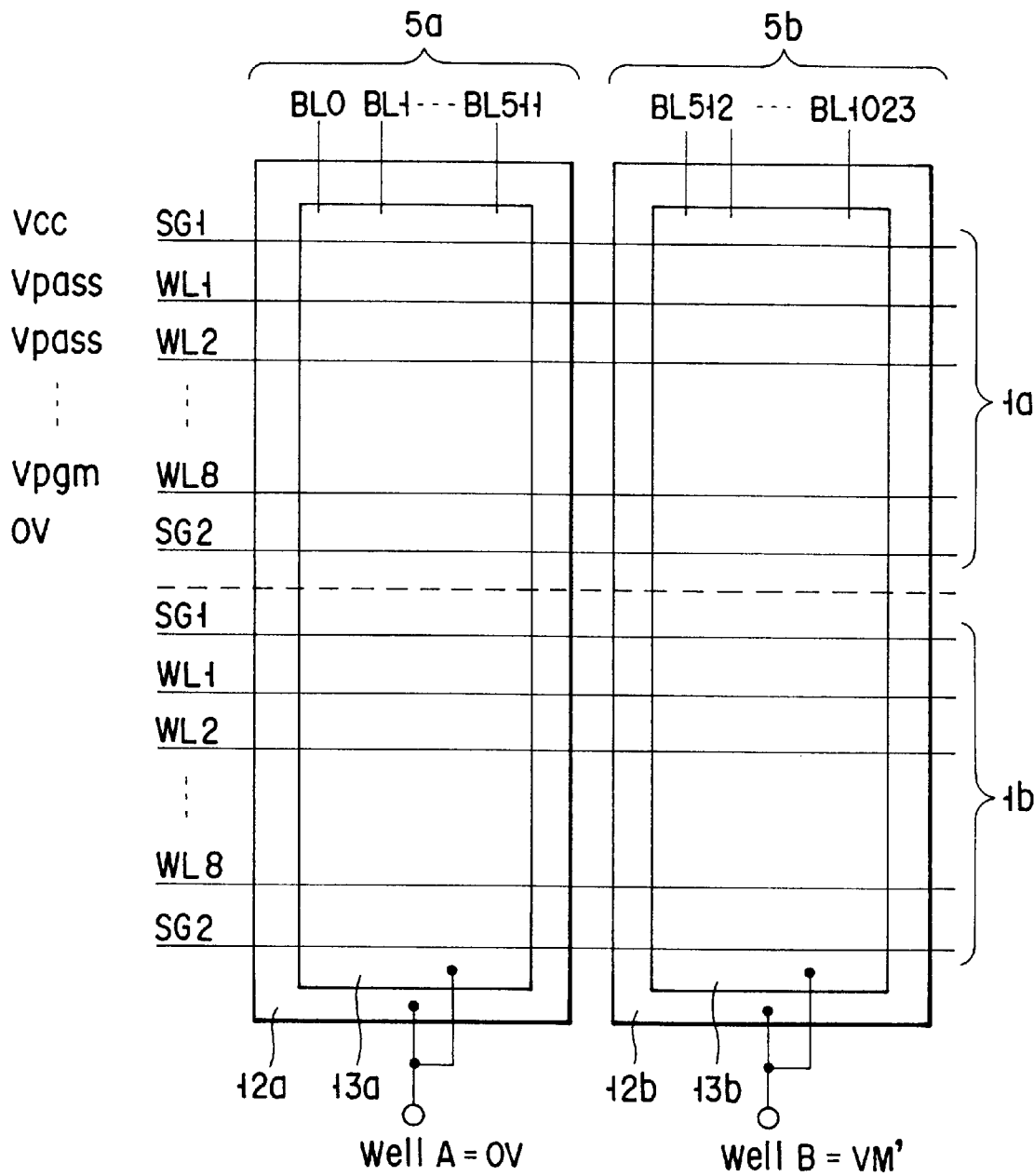
FIG. 11 is a diagram to help explain the operation of writing data into the EEPROM of the second embodiment.

FIG. 11 shows the potentials at the individual sections when, for example, the word line WL8 in the NAND block 1a is selected and the data is written into only the block 5a. A voltage of 0V is applied to the well control terminal WellA in the selected block 5a and an intermediate voltage VM' is applied to the well control terminal WellB in the unselected block 5b. Then, a write voltage Vpgm of about 20V is applied to the selected word line WL8 in the NAND block 1a, the pass voltage Vpass is applied to the remaining word lines, Vcc is applied to the select gate line SG1 on the bit line side, and 0V is applied to the select gate line on the common source line side.

A step-up writing method where the write voltage and pass voltage are increased stepwise each time the write cycle starts may be used. In this case, for example, the write voltage Vpgm is increased in 0.5V increment, starting from 15V to 20V. The pass voltage Vpass is increased in 0.4V increment, starting from 8V to 12V. The step-up writing method may be applied to the first embodiment.

Consequently, the write voltage is applied between the selected word line WL8 and p-type well 13a. According to the writing data previously loaded into the sense amplifier/latch circuit, the potential of the bit line in the block 5a is set in such a manner that the bit line has a voltage 0V for "1" data and a voltage of Vcc for "0" data. At this time, the channel of the memory cell at the intersection of each bit line and the selected word line WL8 is in the floating state for "0" data and is at 0V for "1" data, which selects no electron injection (no data rewriting) and electron injection ("1" data writing), respectively. Because the intermediate voltage VM' is applied to the p-type well 13b in the right block 5b, the write condition will not be set up even if the channel potential becomes VM'-Vbi and the write voltage Vpgm is applied to the selected word line WL8. As a result, the writing will be inhibited.

Conversely, when the well control terminal WellA in the block 5a is set at the intermediate voltage VM' and the well control terminal WellB in the block 5b is set at 0V, the data is rewritten in the right block 5b and the writing is inhibited in the left block 5a. To write the data into the two blocks 5a and 5b simultaneously, 0V is applied to both of the well control terminals WellA and WellB.

In the second embodiment, the intermediate voltage VM in the erase operation may be equal to or different from the intermediate voltage VM' in the write operation.

The operation of writing the data into one of the blocks 5a and 5b in the second embodiment may be identical with that in the first embodiment. In the first embodiment, for example, Vpmg may be applied to the control terminal CG between the blocks 5a and 5b and the data may be written into one of the blocks 5a and 5b in the same manner as in the second embodiment.

Figure 12:
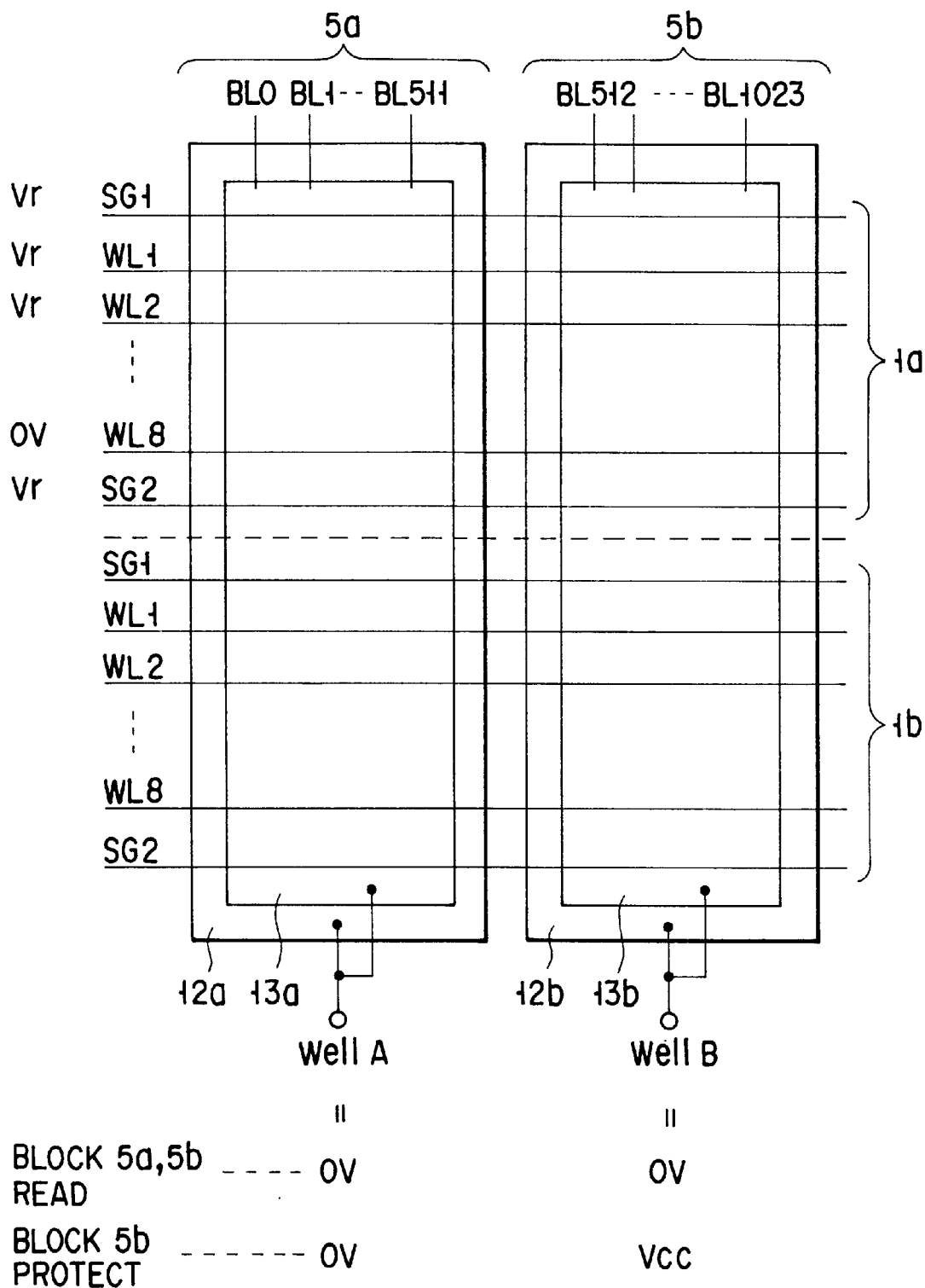
FIG. 12 is a diagram to help explain the operation of reading data from the EEPROM of the second embodiment.

FIG. 12 shows the potentials at the individual sections in reading the data in the second embodiment. Both of the well control terminals WellA and WellB are made 0V. A voltage of 0V is applied to the selected word line WL8 and a pass voltage Vr of, for example, about 4.5V is applied to the remaining unselected word lines and the select gate lines SG1 and SG2. As a result, for example, the bit lines connected to the memory cells into which "1" data has been written with a positive threshold value have a voltage of 1.8V and the bit lines connected to the memory cells into which "0" data has been written with a negative threshold value have a voltage of 0.7V. The sense amplifier/latch circuit 4 judges whether the data is "1" or "0."

In reading the data, one of the blocks 5a and 5b may be inhibited from being read from. FIG. 12 shows the potential relations when the right block 5b is inhibited from being read from. As shown in FIG. 12, for example, Vcc is applied to the well control terminal WellB, which permits the bit line potential to be Vcc−Vbi, regardless of the memory cell data. As a result, all the outputs have "1" data.

As described above, with the second embodiment, too, the memory cell array is divided into blocks in the direction of word lines without dividing the word lines, which enables the data to be rewritten in blocks. Unlike the first embodiment, the second embodiment has no control transistor for connecting the word lines provided between the blocks. With this configuration, erroneous writing and erroneous erasing are prevented reliably by applying the intermediate voltage to the well in the unselected block and the high voltage to the well in the selected block, and bringing all the word lines in the unselected NAND block into the floating state.

While in the above embodiments, it is useful to allocate the rewrite-inhibited blocks to a data management area, for example, storing error flag bits, the present invention is not limited to this. For instance, they may be allocated to a usual data area.

While in the embodiments, the memory cell array has been divided into two blocks, it may be divided into four blocks or eight blocks.

In addition to NAND EEPROMs, the present invention may be applied to all nonvolatile semiconductor memory devices, such as NOR EEPROMs, AND EEPROMs, or DINOR EEPROMs where the data is erased in blocks.

As described above, with the present invention, it is possible to provide a nonvolatile semiconductor memory device which enables the memory cells arranged along a word line to be divided into blocks and rewritten into and the erase block size to be changed, without increasing the number of decoders or permitting erroneous writing or erasing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A nonvolatile semiconductor memory device comprising:
   a semiconductor substrate having a plurality of wells separated from each other;
   a plurality of bit lines provided substantially in parallel on said semiconductor substrate including said wells;
   a plurality of word lines provided substantially in parallel so as to cross said bit lines on said semiconductor substrate including said wells;
   a memory cell array composed of a plurality of memory cells respectively placed at intersections of said bit lines and said word lines, said memory cells being electrically rewritable nonvolatile memory cells to be selected by a corresponding one of said bit lines and at least a corresponding one of said word lines, said memory cell array being divided into a plurality of first blocks in a direction in which said bit lines extend and divided into a plurality of second blocks in a direction in which said word lines extend, and said first blocks being formed on one of said wells and said second blocks being respectively formed on said wells separated from each other;
   a plurality of control transistors each formed in a boundary area between two adjacent ones of said second blocks and connected to said word lines in such a manner that said transistors are inserted in said word lines, respectively;
   a word line driving circuit coupled to said word lines; and
   a plurality of data sense amplifier/latch circuits coupled to said bit lines, respectively.

2. A nonvolatile semiconductor memory device according to claim 1, wherein each of said control transistors is a MOS transistor with a gate electrode and said control transistors formed in said boundary area are connected to each other by way of said gate electrode.

3. A nonvolatile semiconductor memory device according to claim 2, wherein said data stored in corresponding ones of said memory cells included in a selected one of said first blocks and in a selected one of said second blocks are erased in unison by setting potential of corresponding ones of said word lines included in said selected one of said first blocks at a reference voltage, corresponding ones of said word lines included in unselected ones of said first blocks other than said selected one in a floating state, one of said wells in which said selected one of said second blocks is included at an erase voltage higher than said reference voltage, another of said wells in which unselected ones of said second blocks other than said selected one at said reference voltage,
   and at the same time, by controlling a voltage applied to said gate electrode so that corresponding ones of said control transistors included in said corresponding ones of said word lines included in said selected one of said first blocks are in a conducting state and corresponding ones of said control transistors included in said word lines included in said unselected ones of said first blocks are in a nonconducting state.

4. A nonvolatile semiconductor memory device according to claim 1, wherein said memory cell array is composed of a plurality of NAND cells, where said memory cells included in each of said first blocks are connected in series in units of plural ones of said memory cells arranged along each of said bit lines.

5. A nonvolatile semiconductor memory device according to claim 2, wherein each of said control transistors is a depletion-type MOS transistor, with a voltage applied to said gate electrode in data erasure being said reference voltage.

6. A nonvolatile semiconductor memory device according to claim 3, wherein said corresponding ones of said word lines included in said unselected ones of said first block are applied with a voltage higher than said reference voltage and thereafter brought into a floating state.

7. A nonvolatile semiconductor memory device according to claim 1, wherein said control transistors are made conducting when said data is written into said memory cells or when said data is read from said memory cells.

8. A nonvolatile semiconductor memory device according to claim 1, wherein, when said data is written into said memory cells, a voltage higher than said reference voltage is applied to a selected one of said word lines included in said selected one of said first blocks, a pass voltage to make said memory cells conducting is applied to unselected ones of said word lines, said reference voltage is applied to a corresponding one of said wells in which said selected one of said second blocks is included, and a mid-point voltage between said reference voltage and said write voltage is applied to corresponding ones of said wells in which said unselected ones of said second blocks are included.

9. A nonvolatile semiconductor memory device according to claim 1, wherein said unselected ones of said second blocks include a data management area when said data stored in said memory cells is erased.

10. A nonvolatile semiconductor memory device comprising:

a semiconductor substrate having a plurality of wells separated from each other;

a plurality of bit lines provided on said semiconductor substrate including said wells;

a plurality of word lines provided so as to cross said bit lines on said semiconductor substrate including said wells;

a memory cell array composed of a plurality of memory cells respectively placed at intersections of said bit lines and said word lines, said memory cells being electrically rewritable nonvolatile memory cells to be selected by a corresponding one of said bit lines and at least a corresponding one of said word lines, said memory cell array being divided into a plurality of first blocks in a direction in which said bit lines extend and divided into a plurality of second blocks in a direction in which said word lines extend, and said first blocks being formed on one of said wells and said second blocks being respectively formed on said wells separated from each other;

a word line driving circuit coupled to said word lines; and a plurality of data sense amplifier/latch circuits coupled to said bit lines, respectively, wherein when said data stored in corresponding ones of said memory cells included in a selected one of said first blocks and in a selected one of said second blocks is erased, potential of corresponding ones of said word lines included in said selected one of said first blocks is set at a reference voltage, one of said wells in which said selected one of said second blocks is included is set at an erase voltage higher than said reference voltage, and another of said wells in which unselected ones of said second blocks other than said selected one are included is set at an intermediate voltage between said reference voltage and said erase voltage, and said corresponding ones of said memory cells included in said selected one of said first blocks and in said selected one of said second blocks are erased simultaneously.

11. A nonvolatile semiconductor memory device according to claim 10, wherein said corresponding ones of said word lines included in said unselected ones of said first blocks other than said selected one are brought into a floating state.

12. A nonvolatile semiconductor memory device according to claim 10, wherein, when data is written into said memory cells, a voltage higher than said reference voltage is applied to a selected one of said word lines included in said selected one of said first blocks, a pass voltage to make said memory cells conducting is applied to unselected ones of said word lines, said reference voltage is applied to one of said wells in which said selected one of said second blocks is included, and an intermediate voltage between said reference voltage and said write voltage is applied to another of said wells in which said unselected ones of said second blocks are included.

13. A nonvolatile semiconductor memory device according to claim 10, wherein said unselected ones of said second blocks include a data management area when said data stored in said memory cells is erased.

14. A nonvolatile semiconductor memory device according to claim 10, wherein said memory cell array is composed of a plurality of NAND cells, where said memory cells included in each of said first blocks are connected in series in units of plural ones of said memory cells along each of said bit lines.

* * * * *